（12) United States Patent
Moffatt

(10) Patent No.: US 9,341,858 B2
(45) Date of Patent: *May 17, 2016

(54) APPARATUS AND METHOD FOR SPECKLE REDUCTION IN LASER PROCESSING EQUIPMENT

(71) Applicant: Applied Materials, Inc., Santa Clara, CA (US)

(72) Inventor: Stephen Moffatt, St. Brelade (JE)

(73) Assignee: Applied Materials, Inc., Santa Clara, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 14/180,010

(22) Filed: Feb. 13, 2014

(65) Prior Publication Data

US 2014/0192533 A1 Jul. 10, 2014

Related U.S. Application Data

(63) Continuation of application No. 13/625,420, filed on Sep. 24, 2012, now Pat. No. 9,069,183.

(60) Provisional application No. 61/540,215, filed on Sep. 28, 2011.

(51) Int. Cl.
  *G02B 27/10* (2006.01)
  *F21V 5/00* (2015.01)
  (Continued)

(52) U.S. Cl.
  CPC .............. *G02B 27/48* (2013.01); *B23K 26/063* (2013.01); *B23K 26/0622* (2015.10);
  (Continued)

(58) Field of Classification Search
  CPC ...... G02B 5/00; G02B 5/045; G02B 27/0927; G02B 27/095; G02B 27/10; G02B 27/106; G02B 27/48; B23K 26/00; B23K 26/06; B23K 26/0626; B23K 26/063; B23K 26/0635; B23K 26/0648; B23K 26/0652; B23K 26/0665; F21V 5/00; F21V 5/002; F21V 5/004; F21V 5/007; F21S 8/10
  USPC .......... 359/618–623, 637, 639, 640; 362/235, 362/259, 331, 333, 551, 554, 612, 613, 625
  See application file for complete search history.

(56) References Cited

U.S. PATENT DOCUMENTS 4,229,067 A   10/1980   Love
4,521,075 A   6/1985    Obenschain et al.
(Continued)

FOREIGN PATENT DOCUMENTS

JP   2008159348 A   7/2008

OTHER PUBLICATIONS

International Search Report and Written Opinion for PCT/US2012/057246 dated Mar. 18, 2013.
(Continued)

*Primary Examiner* — Loha Ben
(74) *Attorney, Agent, or Firm* — Patterson & Sheridan, LLP

(57) ABSTRACT

Embodiments described herein provide apparatus and methods for processing semiconductor substrates with uniform laser energy. A laser pulse or beam is directed to a spatial homogenizer, which may be a plurality of lenses arranged along a plane perpendicular to the optical path of the laser energy, an example being a microlens array. The spatially uniformized energy produced by the spatial homogenizer is then directed to a refractive medium that has a plurality of thicknesses. Each thickness of the plurality of thicknesses is different from the other thicknesses by at least the coherence length of the laser energy.

10 Claims, 5 Drawing Sheets

(51) Int. Cl.
*G02B 27/48* (2006.01)
*B23K 26/06* (2014.01)

(52) U.S. Cl.
CPC ........ *B23K 26/0626* (2013.01); *B23K 26/0648* (2013.01); *F21V 5/002* (2013.01); *F21V 5/007* (2013.01); *G02B 27/10* (2013.01); *B23K 26/0624* (2015.10); *B23K 26/0635* (2013.01); *F21V 5/004* (2013.01)

(56) References Cited

U.S. PATENT DOCUMENTS

| | | | |
|---|---|---|---|
| 5,892,866 A | 4/1999 | Bristow et al. | |
| 6,250,778 B1* | 6/2001 | Doumuki | 362/327 |
| 6,650,480 B2 | 11/2003 | Tanaka | |
| 8,434,909 B2* | 5/2013 | Nichol et al. | 362/296.01 |
| 8,624,961 B2* | 1/2014 | Li | 348/46 |
| 2006/0066870 A1 | 3/2006 | Korngut et al. | |
| 2012/0080411 A1* | 4/2012 | Mizuyama et al. | 219/121.6 |

OTHER PUBLICATIONS

"Mode Scrambler Requirements for Overfilled Launching Conditions to Multimode Fibers", Telecommunications Industry Association, Aug. 1998, 19 pages.
https://en.wikipedia.org/wiki/Fabry%E2%80%93P%C3%A9rot_interferometer.
https://www.rp-photonics.com/etalons.html?s=ak.

* cited by examiner

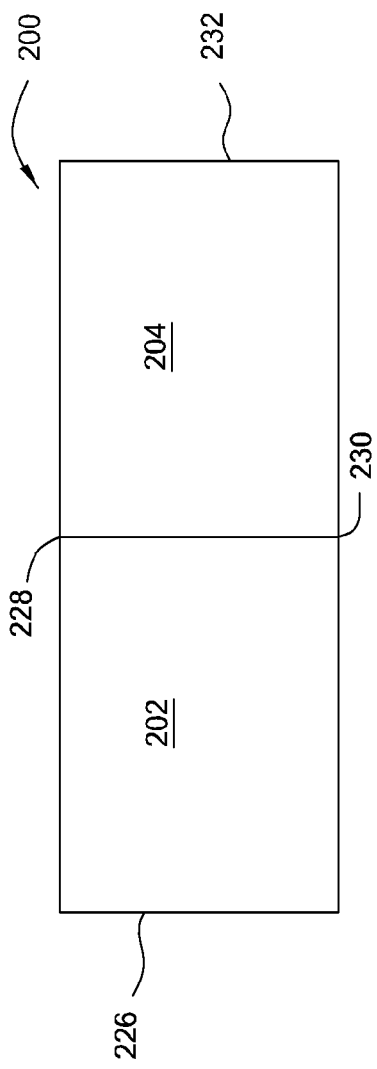
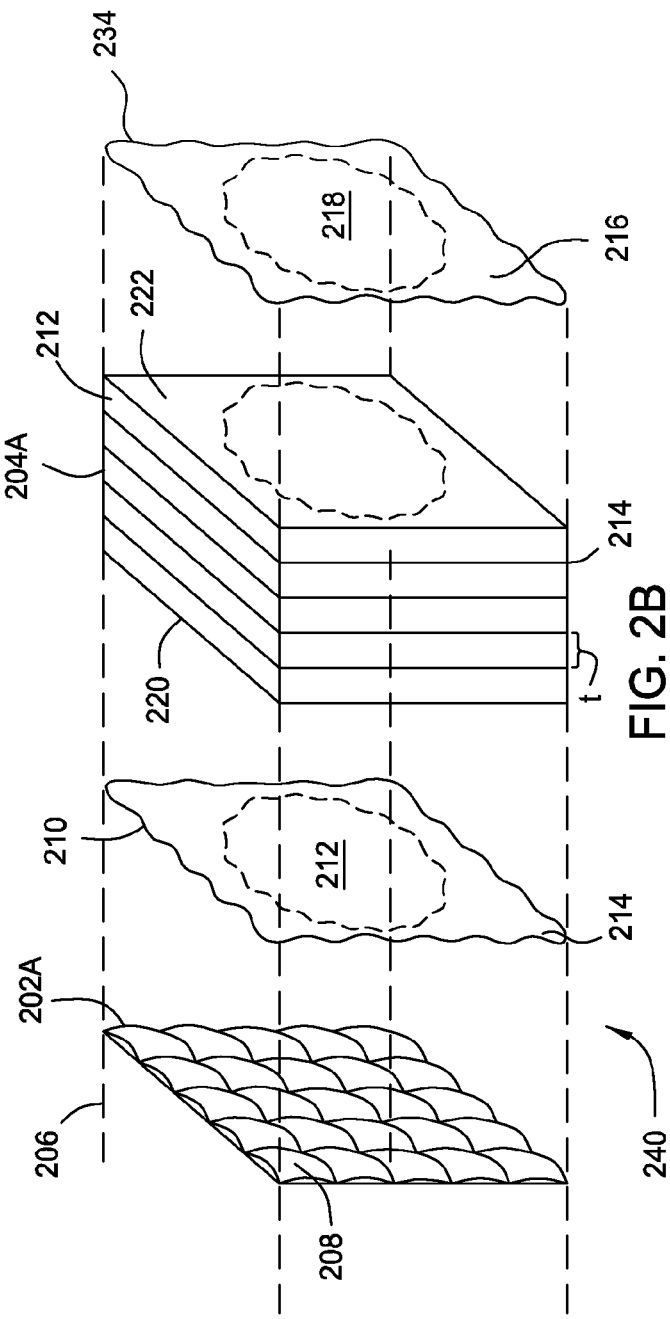
FIG. 2A
FIG. 2B

APPARATUS AND METHOD FOR SPECKLE REDUCTION IN LASER PROCESSING EQUIPMENT

CROSS-REFERENCE TO RELATED APPLICATIONS

This application is a continuation of U.S. patent application Ser. No. 13/625,420, filed Sep. 24, 2012, now U.S. Pat. No. 9,069,183, which claims benefit of U.S. provisional patent application Ser. No. 61/540,215, filed Sep. 28, 2011. Each of the aforementioned related patent applications is herein incorporated by reference.

FIELD

Embodiments described herein relate to thermal processing of semiconductor substrates. More specifically, embodiments described herein relate to laser thermal processing of semiconductor substrates.

BACKGROUND

In semiconductor manufacturing, thermal processes are commonly used to melt, anneal, crystallize, and activate dopants in semiconductor substrates. High power levels are generally used to process semiconductor substrates, and lasers are frequently used to achieve the high power levels. Lasers produce coherent light that has a non-uniform spatial distribution of energy. Depending on the structure of the lasing medium, the distribution will have local maxima and minima that result in higher and lower energy intensity, which leads to non-uniform processing of substrates. Moreover, the shape of the laser energy field is often different from the desired shape of the processing region.

Much work has been devoted to improving the uniformity of a laser energy field and adapting its shape to a desired geometry, with improvement roughly keeping pace with the shrinking scale of semiconductor devices. Further improvement is still needed, however, as the trend of miniaturization continues.

SUMMARY

Embodiments described herein provide apparatus and methods for processing semiconductor substrates with uniform laser energy. A laser pulse or beam is directed to a spatial homogenizer, which may be a plurality of lenses arranged along a plane perpendicular to the optical path of the laser energy, an example being a microlens array. The spatially uniformized energy produced by the spatial homogenizer is then directed to a refractive medium that has a plurality of thicknesses. Each thickness of the plurality of thicknesses is different from the other thicknesses by at least the coherence length of the laser energy.

In some embodiments, the refractive medium is a unitary medium, such as a prism. The prism may comprise a plurality of columns of different length. The refractive medium typically has a receiving surface and a plurality of transmission surfaces, all of which are perpendicular to the optical path of the laser energy. The distance between the transmission surfaces and the receiving surface are different, constituting a plurality of thicknesses of the prism. In another embodiment, the refractive medium is a collection of rods of different lengths. In another embodiment, the refractive medium is a plurality of refractive plates.

BRIEF DESCRIPTION OF THE DRAWINGS

So that the manner in which the above-recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 2A is a plan view of a uniformizer according to one embodiment.

FIG. 2B is a perspective view of a uniformizer according to another embodiment.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1:
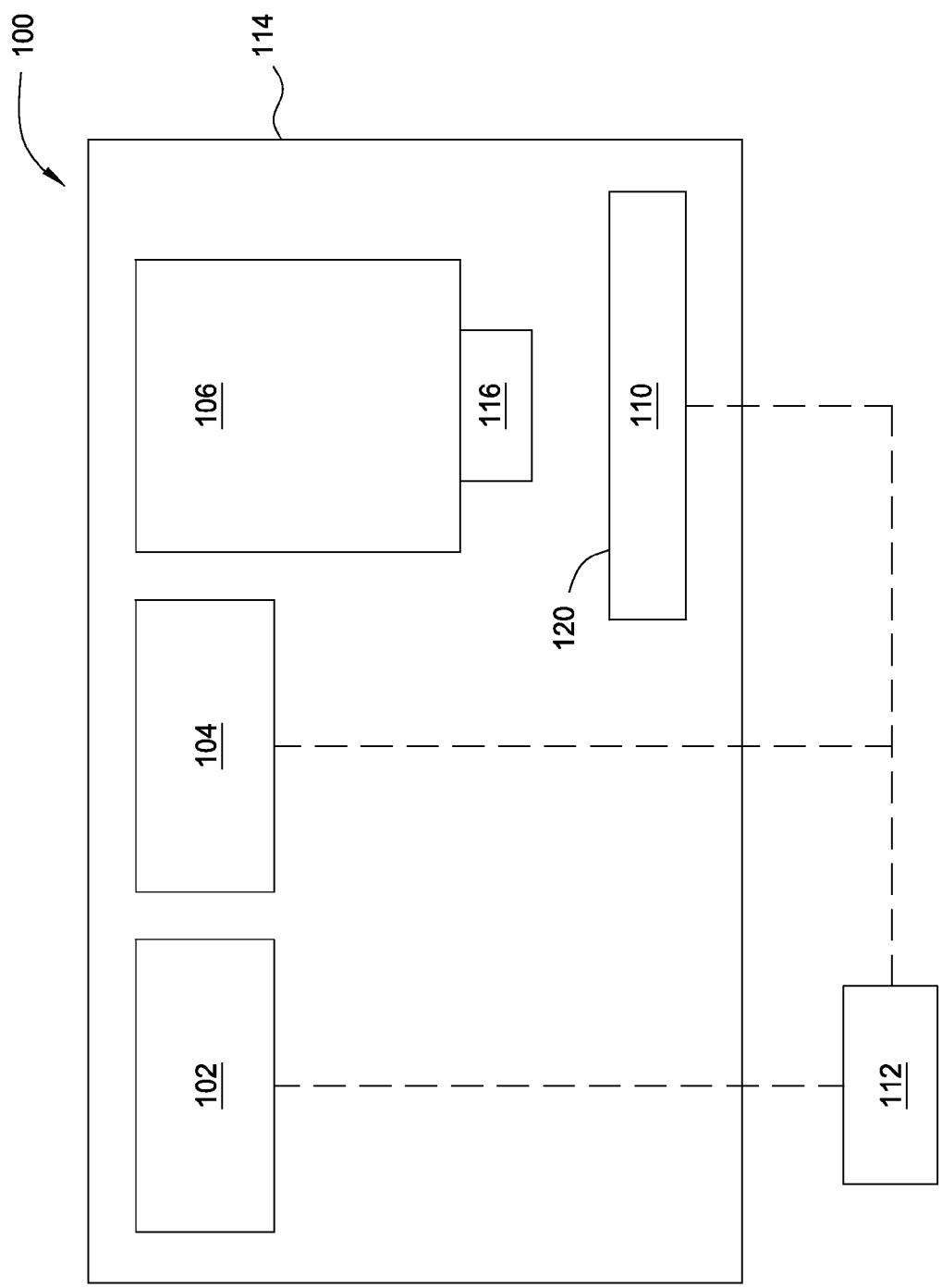
FIG. 1 is a schematic view of a thermal processing apparatus according to one embodiment.

An embodiment of a thermal processing apparatus 100 is shown schematically in FIG. 1. An energy source 102, which may be a source of coherent light such as a laser, is disposed in an enclosure 114. The energy source 102 delivers energy to an optional combiner 104, used to combine energy beams from more than one generator of the energy source 102, in the event multiple generators are used. An energy beam proceeds from the combiner 104 into a uniformizer 106, which reorganizes the energy beam into a uniform energy beam, which is passed through an aperture 116 to give a desired field shape, and then to a work surface 120 of a stage 110. A substrate being processing is disposed on the work surface 120, and energy passing through the aperture 116 typically impinges the substrate in a substantially perpendicular orientation. The energy forms an energy field that covers a treatment area of the substrate. After a first treatment area is processed, the substrate is moved to expose a subsequent treatment area to the energy field by moving the stage 110. In one example, the stage 110 is a precision x-y stage. A controller 112 may be coupled to the stage 110 to control movement thereof, and to the energy source 102 and the combiner 104 to control energy delivery to the work surface 120. The apparatus 100 forms an energy field having a desired geometric shape and a highly uniform energy density distribution to promote uniform processing of all treatment areas on a substrate.

The energy source 102 may comprise a plurality of lasers 102A, 102B. High power continuous wave or pulsed lasers are typically used. The laser energy may range from essentially unimodal energy ($M^2 \approx 1$) to highly modal energy ($M^2 > 30$) having hundreds or thousands of spatial modes. The laser energy from each generator may be collimated if etendue is large to prevent dispersive energy loss during optical processing. Pulsed lasers may have pulse durations from the femtosecond range to the microsecond range. In one embodiment, four q-switched, frequency-doubled, Nd:YAG lasers emitting 532 nm laser energy between 30 MW and 50 MW in pulses ranging from about 5 nsec to about 30 nsec per pulse with $M^2$ between about 500 and about 1000 may be used.

Figure 4:
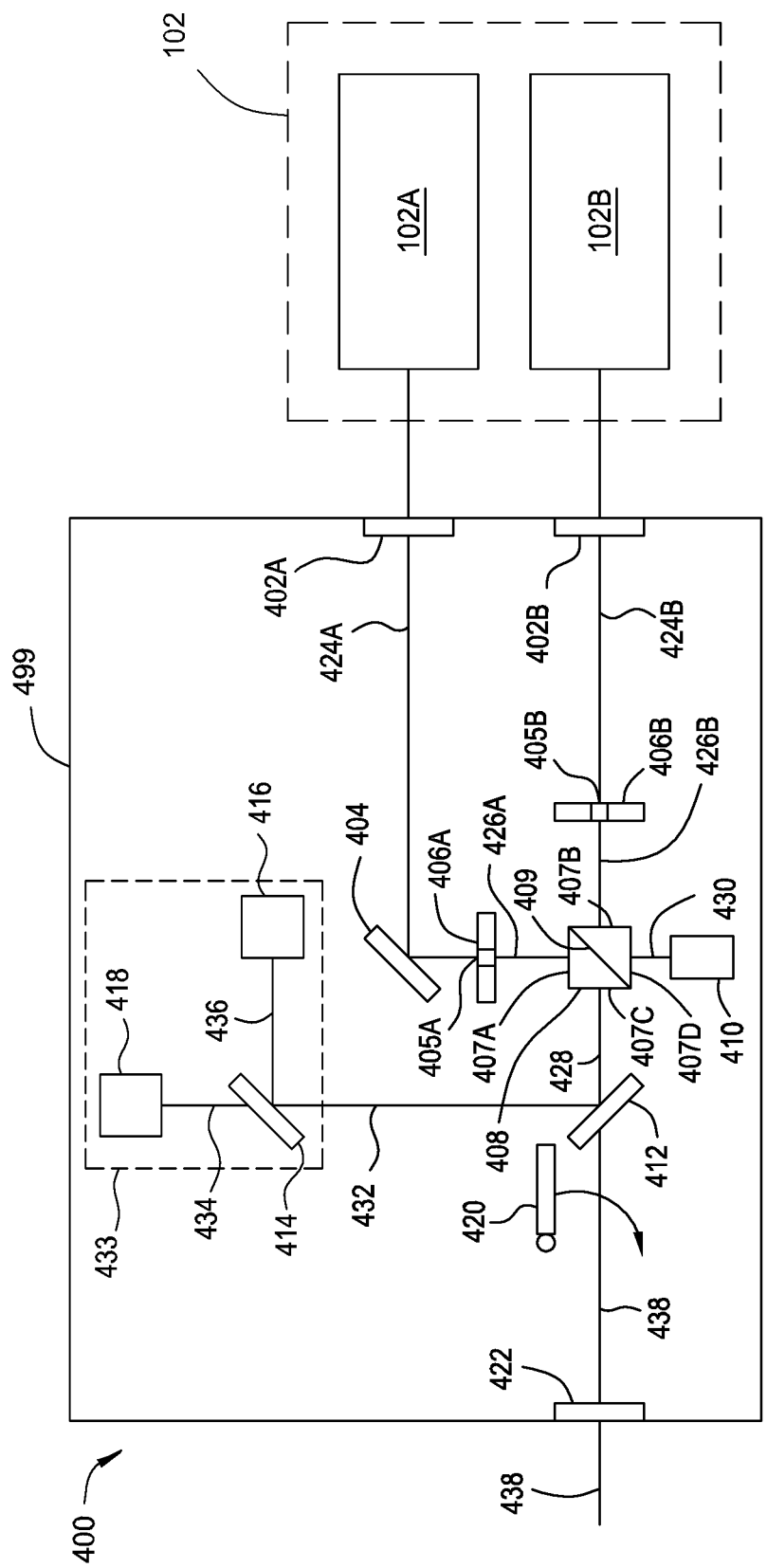
FIG. 4 is a plan view of a combiner according to an embodiment.

The energy from the energy source 102 may be directed to the combiner 104, if more than one generator is included in the energy source 102. The combiner 104 creates one energy beam or pulse from more than one energy beam or pulse. FIG. 4 is a plan view of a combiner 400, according to an embodiment, which may be used as the optional combiner 104. Using optics contained in an enclosure 499 to prevent light pollution, the combiner 400 combines a first input 424A received from the energy source 102 and a second input 424B received from the energy source 102 into one output 438. The two inputs 424A, 424B enter the combiner 400 through input lenses 402A and 402B disposed in openings of the enclosure 499. In the embodiment of FIG. 4, the two input lenses 402A, 402B are aligned along one surface of the enclosure 499, with the inputs 424A, 424B entering the enclosure 499 in a substantially parallel orientation.

The two inputs 424A/B are directed to a combining optic 408 that combines the two pulses into one pulse 438. The combining optic has a first entry surface 407A oriented perpendicular to the entry path of a first directed input 426A and a second entry surface 407B oriented perpendicular to the entry path of a second directed input 426B to avoid any refraction of the directed inputs 426A/B upon entering the combining optic 408. The combining optic 408 of FIG. 2A is a crystal that has a selecting surface 409 oriented such that first and second directed inputs 426A/B each strike the selecting surface 409 at an angle of approximately 45°. The selecting surface 409 interacts with light selectively depending on the properties of the light. The selecting surface 409 of the combining optic 408 may reflect the first directed input 426A and transmit the second directed input 426B to create a combined output 428. To facilitate combination of the inputs, each of the directed inputs 426A/B may be tailored to interact with the selecting surface 409 in a particular way.

In one embodiment, the selecting surface 409 is a polarizing surface. The polarizing surface may have a linear axis of polarity, such that polarizing the directed input 426B parallel to the axis of the polarizing surface allows the directed input 426B to be transmitted by the polarizing surface, and polarizing the directed input 426A perpendicular to the axis of the polarizing surface allows the directed input 426A to be reflected by the polarizing surface. Aligning the two directed inputs 426A/B to the same spot on the polarizing surface creates the combined output 428 emerging from a first exit surface 407C of the combining optic 408 perpendicular to the surface 407C to avoid any refraction of the combined output 428. Alternately, the selecting surface 409 may be a circular polarizer, with the directed input 426A circularly polarized opposite the sense of the circular polarizer for reflection, and the directed input 426B circularly polarized in the same sense as the circular polarizer for transmission. In another embodiment, the directed inputs 426A/B may have different wavelengths, and the selecting surface 409 may be configured to reflect light of one wavelength and to transmit light of another wavelength, such as with a dielectric mirror.

In a polarization embodiment, polarization of the directed inputs 426A/B is accomplished using polarizing filters 406A/B. The polarizing filters 406A/B polarize the inputs 424A/B to be selectively reflected or transmitted by the selecting surface 409 of the combining optic 408. The polarizing filters 406A/B may be wave plates, for example half-wave plates or quarter-wave plates, with polarizing axes oriented orthogonal to each other to produce the orthogonally polarized light for selective reflecting and transmission at the selecting surface 409. The axis of each polarizing filter 406A/B may be independently adjusted, for example with rotational actuators 405A/B, to precisely align the polarization of the directed inputs 426A/B with the polarization axis of the selecting surface 409, or to provide a desired angle of deviation between the polarization axis of an input pulse 426A/B and the polarization axis of the selecting surface 409.

Adjusting the polarization axis of the directed inputs 426A/B controls intensity of the combined output 428, because a polarizing filter transmits incident light according to Malus' Law, which holds that the intensity of light transmitted by a polarizing filter is proportional to the incident intensity and the square of the cosine of the angle between polarization axis of the filter and polarization axis of the incident light. Thus, rotating the polarizing filter 406A so that the polarization axis of the polarizing filter 406A deviates from an orientation perpendicular to the polarization axis of the selecting surface 409 results in a portion of the directed input 426A being transmitted through the selecting surface 409. Likewise, rotating the polarizing filter 406B so that its polarization axis deviates from an orientation parallel to the axis of the selecting surface 409 results in a portion of the directed input 426B being reflected from the selecting surface 409. This "non-selected" light from each of the directed inputs 426A/B is combined into a rejected energy 430 that exits the combining optic 408 through a second exit surface 407D into an energy dump 410. In this way, each of the polarizing filters acts as a dimmer switch to attenuate the intensity of energy passing through the polarizing filters.

It should be noted that the two directed inputs 426A/B that are to be combined by the combining optic 408 are directed toward opposite sides of the selecting surface 409 for selective reflection and transmission. Thus, the first input 402A is directed along a path that brings the first input 402A toward a reflecting side of the selecting surface 409 by a reflector 404, while the second input 402B is directed toward transmitting side of the selecting surface 409. Any combination of reflectors may naturally be used to steer light along a desired path within the combiner 400.

The combined output 428 may interact with a first splitter 412 that splits the combined output 428 into the output 438 and a sample 432. The splitter 412 may be a partial mirror or a pulse splitter. The sample 432 may be directed to a diagnostic module 433 that analyzes properties of the sample 432 to represent properties of the output 438. In the embodiment of FIG. 2A, the diagnostic module 433 has two detectors 416 and 418 that detect the temporal shape of a sample and the total energy content of a sample, respectively. A second splitter 414 forms a first sub-sample 436 and a second sub-sample 434 for input to the respective detectors. The temporal shape detector 416 is an intensity monitor that signals intensity of energy striking the monitor in very short time scales. Energy pulses incident on the temporal shape detector may have total duration from 1 picosecond (psec) to 100 nsec, so a temporal shape detector suitable for registering a temporal shape on such time scales, which may be a photodiode or photodiode array, renders intensity signals at useful subdivisions of these time scales. The energy detector 418 may be a pyroelectric device, such as a thermocouple, that converts incident electromagnetic radiation to voltage that can be measured to indicate the energy content of the sub-sample 434. Because the first and second splitters 412 and 414 sample a known fraction of incident light based on the transmitting fraction of the first and second splitters 412 and 414, the energy content of the output 438 may be calculated from the energy content of the sub-sample 434.

Signals from the diagnostic module 433 may be routed to the controller 112 of FIG. 1, which may adjust operation or the energy source 102 or the combiner 400 to achieve desired results. The controller 112 may adjust an electronic timer coupled to an active q-switch of each laser to control pulse timing in response to results from the temporal shape detector 416. Cycling the active q-switch faster makes shorter pulses, and vice versa. The controller 112 may be coupled to the rotational actuators 405A/B to adjust the intensity of the output 438, based on results from the energy detector 418, by adjusting the polarization angle of light passing through the polarizing filters 406A/B. In this way, the duration and energy content of the output 438 may be independently controlled. The controller 112 may also be configured to adjust power input to each laser.

The output 438 may be interrupted by a shutter 420, if desired. The shutter 420 may be provided as a safety device in the event the laser energy emerging from the combiner 400 is to be interrupted to make an adjustment to a component subsequent to the combiner 400. The output 438 exits the combiner 400 through an output lens 422.

The output 438 is a combination of the two directed inputs 426A/B. As such the output 438 has properties that represent a combination of the properties of the two directed inputs 426A/B. In the polarization example described above, the output 438 may have an elliptical polarization representing the combination of two orthogonally polarized directed inputs 426A/B having different intensities according to the degree of transmission/reflection of each of the directed inputs 426A/B at the selecting surface 409. In an example using incident wavelength at the selecting surface 409 to combine two inputs, the output 438 will have a wavelength representing the combined wavelength of the two directed inputs 426A/B according to their respective intensities.

For example, a 1,064 nm reflecting dielectric mirror may be disposed at the selecting surface 409 of the combining optic 408. The directed input 426A may have wavelength of approximately 1,064 nm with intensity A for reflecting from the selecting surface 409, and the directed input 426B may have a wavelength of 532 nm with intensity B for transmitting through the selecting surface 409. The combined output 428 will be a co-propagating bi-pulse of two photons having the wavelengths and intensities of the directed inputs 426A/B, with total energy content that is the sum of the two pulse energies.

The combiner 400 of FIG. 4 may be used to combine two inputs into one output. Optical combiners comprising similar elements in different configurations may be used to further combine outputs from the combiner 400, if desired. For example, a pair of combiners such as the combiner 400 may combine four inputs into two intermediates based on polarization, and a third combiner may combine the two intermediates into one output based on wavelength.

Energy from the optional combiner 104 (or directly from the energy source 102) is directed to the uniformizer 106. FIG. 2A is a plan view of a uniformizer 200, according to one embodiment, which may be used as the uniformizer 106 in the apparatus 100 of FIG. 1. The uniformizer 200 comprises a spatial decorrelator 202 and a temporal decorrelator 204. The decorrelators 202 and 204 are shown schematically in FIG. 2A to illustrate that the spatial decorrelator 202 is positioned prior to the temporal decorrelator 204 along the optical path for most embodiments. The decorrelators 202 and 204 may be in physical contact, as suggested in FIG. 2A, or they may be spaced apart if desired to allow propagation through a different medium for some distance between the decorrelators 202 and 204.

The spatial decorrelator 202 mixes energy from various areas of a cross-sectional image incident on a receiving surface 226 of the spatial decorrelator 202. Each component area of the cross-sectional image is projected into a larger field, in some cases onto the entire resultant image field, to create a composite image of the component areas transmitted from a transmission surface 228 of the spatial decorrelator 202. Spatial modes present in the incident energy are overlapped in the resulting composite image to produce a spatially uniformized image. Local intensity maxima and minima are superimposed to reduce prevalence of the spatial modes and energy distribution non-uniformity arising from spatial modes.

The temporal decorrelator 204 reduces temporal correlation of energy incident on a receiving surface 230 of the temporal decorrelator 204 to produce a decorrelated image transmitted from a transmission surface 232 of the temporal decorrelator 204. The decorrelated image is phase-uniformized relative to the incident energy to reduce interference patterns associated with temporally coherent energy. The temporal decorrelator 204 generally directs the incident energy through multiple different path lengths within a refractive medium to decorrelate the incident energy.

FIG. 2B is a perspective view of a uniformizer 240 according to another embodiment. The uniformizer 240 has a plurality of lenses 202A, which may be a microlens array, arranged in intersection with the optical path of an input energy 206. The plurality of lenses 202A is disposed along a plane that is substantially perpendicular to the propagation direction of the input energy 206. Each lens 208 of the plurality of lenses 202A receives a portion of the input energy and projects that portion onto a composite image 210 with an area larger than the area of the received portion of the incident energy. Thus, a portion of the image from one lens 208 overlaps with a portion of each of the images from every other lens 208 to form the composite image 210. The composite image 210 thus formed may have a central region 212 that has higher intensity and/or spatial uniformity than a peripheral region 214 of the composite image 210, depending on the characteristics of the lenses 208 and the arrangement of the plurality of lenses 202A. It should be noted that, although a rectangular cross-section is illustrated in FIG. 2B, embodiments may have any desired cross-sectional shape, such as circular, elliptical, square, hexagonal, or other polygonal and/or irregular shapes. Additionally, in some embodiments, the plane of the plurality of lenses 202A may be angled with respect to the propagation direction of the input energy 206. Alternately, the lenses 208 may be staggered, which is to say that each lens 208 may be located some distance from a datum plane, and the distance of each lens 208 from the datum plane may be different. Such an embodiment may provide added spatial uniformization by passing portions of the transmitted image of most of the lenses 208 through another lens to produce the spatially uniformized image 210.

The plurality of lenses 202A is shown in FIG. 2B as disposed along a surface that defines a plane perpendicular to the propagation direction of the input energy 206. In alternate embodiments, the plurality of lenses 202A may be disposed along a surface that defines a curve with a locus of curvature located on the axis of propagation of the incident energy 206 on the transmitting side of the plurality of lenses 202A. Such a configuration may be useful in reducing dispersion of light from the plurality of lenses 202A, if there is space between the plurality of lenses 202A and the temporal decorrelator 204A. If there is no space between the plurality of lenses 202A and the temporal decorrelator 204A, dispersive energy may be reflected by the refractive edges of the temporal decorrelator 204A, or a reflective material may surround one or both of the plurality of lenses 202A and the temporal decorrelator 204A.

The plurality of lenses 202A is shown in FIG. 2B as being part of a unitary object. Alternately, one or more of the lenses 208 may be detached from the other lenses 208, if desired. Using a plurality of detached lenses may be helpful in embodiments where adjusting the lenses from time to time improves performance. The lenses 208 may also be detached if, as described above, the lenses are at different distances from a datum plane.

The composite image 210 from the plurality of lenses 202A passes to a receiving surface 220 of a temporal decorrelator 204A. The temporal decorrelator 204A is a refractive medium that comprises a plurality of refractive panes 212 in contact at interface surfaces 214. Each of the refractive panes 212 has a thickness "t", which may be the same or different. Energy entering the receiving surface 220 of the refractive medium traverses through the refractive medium to the first interface surface 214. A small portion of the energy is reflected at the first interface surface 214, returning to the receiving surface 220, where a portion thereof is reflected back into the refractive medium resulting in portions of the incident energy that travel different path lengths through the refractive medium. The same reflection/re-reflection pattern occurs at all the interface surfaces 214, resulting in a large variety of different path lengths traveled through the refractive medium. This reflection/re-reflection phenomenon in the panes 212 is also an illustration of characteristics of etalons. Coherent light that travels different path lengths through a refractive medium will emerge phase-decorrelated provided the difference in path length is not an integer multiple of the wavelength of the coherent light. If the different path lengths are different in length by an amount greater than a coherence length, sometimes represented as the speed of light divided by pi and the optical bandwidth, of the incident energy, decorrelation is improved.

The panes 212 may be the same material or different materials, and may be any refractive material that is optically transmissive. The panes may be solid, liquid, or gas, for example pane-shaped containers with refractive liquid or gas inside. Exemplary refractive materials are glass, quartz, and sapphire. Clear liquids such as water, and gases other than air that may have refractive indices relatively different from air, may also be used. The panes 212 in FIG. 2B are shown contacting at the interface surfaces 214, but one or more of the panes 212 may be spaced apart from the others, such that one or more of the interface surfaces 214 comprises two surfaces of two neighboring panes 212 separated by a space. Such an arrangement may increase the temporal decorrelation at the risk of some energy loss in the spaces. Surrounding the panes 212 on the edges thereof with a reflective material may reduce such losses in some cases.

The decorrelated image 234 emerging from the transmission surface 222 of the temporal decorrelator 204A has a cross-sectional shape similar to the energy that enters the receiving surface 220, with a central area 218 that has more overlapping image portions from the plurality of lenses 202A, and therefore more spatial uniformity than a peripheral area 216 of the decorrelated image 234.

Figure 2C:
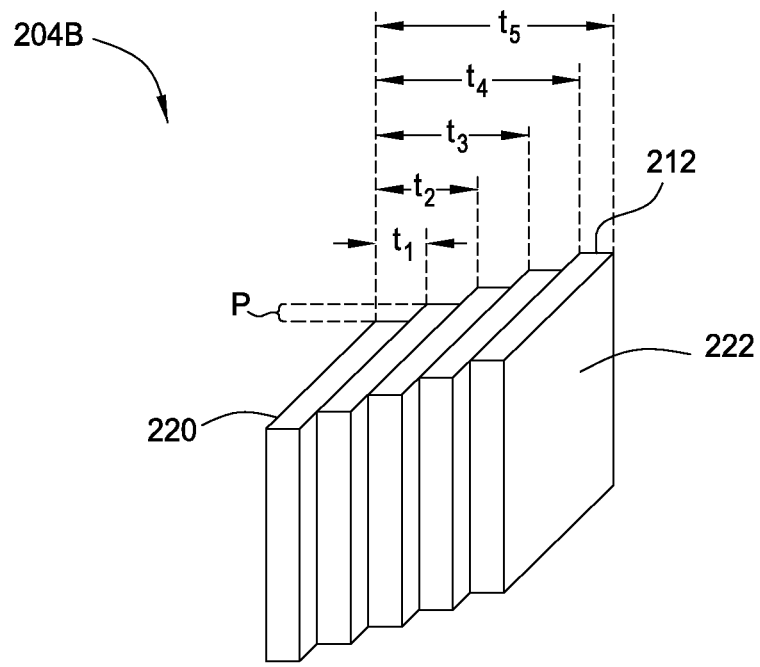
FIG. 2C is a perspective view of a refractive medium according to one embodiment.

FIG. 2C is a perspective view of a temporal decorrelator 204B according to another embodiment. The temporal decorrelator 204B of FIG. 2C may be used as the temporal decorrelator 204 of the uniformizer 200 of FIG. 2A. The temporal decorrelator 204B of FIG. 2C is similar in many respects to the decorrelator 204A of FIG. 2B, (including reflection/re-reflection phenomenon mentioned previously) but differs in that the panes 212 are staggered in a direction transverse to the propagation direction of the incident energy 206 (FIG. 2A). Staggering the panes 212 provides a refractive medium having a plurality of thicknesses $t_1$-$t_5$ through which different portions of the incident energy propagate. Thus, a portion of the incident energy travels through a thickness $t_1$ of the refractive medium, experiencing a refractive effect on optical path length of $t_1$. Another portion of the incident energy travels through a thickness $t_2$ of the refractive medium, experiencing a refractive effect on optical path length of $t_2 > t_1$, and so on with $t_3$, $t_4$, and $t_5$. If the panes 212 are of different thicknesses, the refractive medium may have up to 2n−1 thicknesses, where n is the number of panes. Multiplying the number of different optical path lengths increases the temporal decorrelation available, particularly if all the differences among all the optical path lengths are greater than the coherence length of the incident radiation.

The panes 212 in FIG. 2C are staggered a uniform distance or pitch "p", each pane 212 relative to the prior pane 212, in one direction, say for example in the "positive-x" direction. In alternate embodiments, some panes may also be staggered in the "negative-x" direction as well as the "positive-x" direction, to yield a refractive medium with portions extending to both sides on one axis orthogonal to the direction of propagation. In other alternate embodiments, some panes may also be staggered along the y direction, in the positive and/or negative sense. Additionally, although the decorrelator 204B of FIG. 2C is depicted as a collection of panes 212, the decorrelator 204B may also be a unitary medium, such as a collection of fused panes, or a prism, having a plurality of thicknesses constituted according to any of the modes described above. Fused panes of the same material may be fused in a way that preserves a refractive boundary between the panes to give a similar result as a collection of stacked panes, if desired. For example, the decorrelator may comprise a plurality of etalons, such as 204B shown in FIG. 2C.

The pitch "p" of pane staggering, in the context of panes having similar size and shape, may be constant for all panes 212, or may be different. If the average pitch p satisfies the relation 2(n−1) p<w, where n is the number of panes and w is the sum of the widths of the first and last pane in the stack, then all panes in the stack will overlap to an extent. It should be noted that the panes 212 need not be all of the same shape or size, provided that any optical path changes due to refractive effects are managed according to the specific embodiment. In one embodiment, each of the thicknesses $t_1$-$t_n$ has an equal areal coverage, such that an equal area of the incident energy field passes through each thickness of the refractive medium 204B. Naturally, in other embodiments, the areal coverage of the thicknesses $t_1$-$t_n$ may be different.

In one embodiment, the decorrelator 204B is a collection of five glass panes, each about 1 cm thick and staggered uniformly in one direction with a pitch of about 1 cm per pane. The panes are about 1.0 cm×0.6 cm×1 cm, so as to cover the optical path of an incident energy having a cross-sectional dimension of about 1 cm.

Figure 2D:
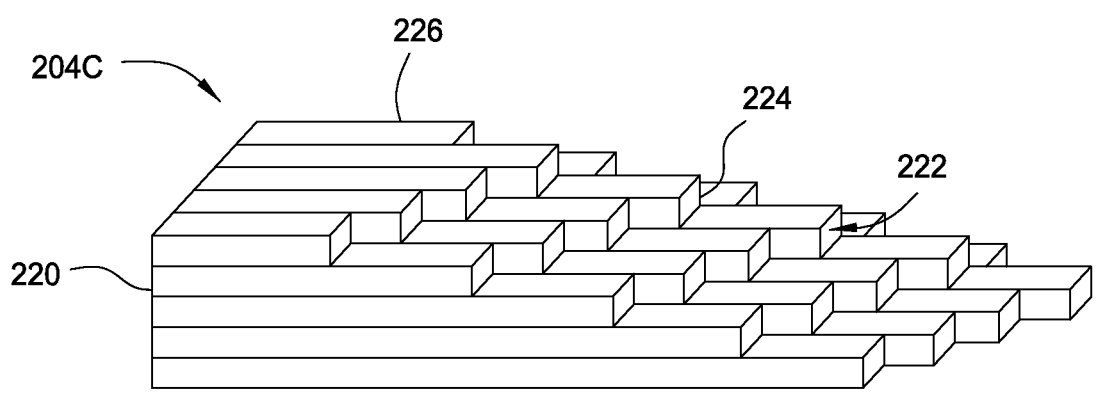
FIG. 2D is a perspective view of a refractive medium according to another embodiment.

FIG. 2D is a perspective view of a temporal decorrelator 204C according to another embodiment. The temporal decorrelator 204C may be used as the temporal decorrelator 204 in the uniformizer 200 of FIG. 2A. According to the same general prinicple embodied by the decorrelator 204B of FIG. 2C, the decorrelator 204C is a refractive medium that defines a plurality of optical path lengths for different portions of an incident energy field to traverse, giving rise to temporal decorrelation of the incident energy field. In the embodiment of FIG. 2C, a plurality of columns 224 is disposed intersecting the optical path of the combined image 210 (FIG. 2B). The columns 224 are oriented to extend along an axis parallel to the direction of propagation of the combined image 210 in most cases. The columns 224 collectively form a refractive medium 226 that has a plurality of thicknesses through which portions of an incident energy field travel.

The columns 224 may have essentially random lengths, as depicted in FIG. 2C, and each column 224 may have a different length from every other column 224, but neither randomness nor a number of different lengths equal to the number of columns is required. A larger number of different thicknesses or column lengths will result in better overall decorrelation, and more thicknesses or column lengths that differ from the other lengths by more than a coherence length of the incident energy will improve results still more.

The columns 224 with different lengths provide a plurality of transmitting surfaces 222 opposite a receiving surface 220. Energy incident on the receiving surface 220 travels through the various columns 224 according to their lengths and emerges from each of the transmitting surfaces 222 at different times. It should be noted that the columns 224 need not be arranged with a flat receiving surface 220, as shown in FIG. 2C, but may be arranged so as to provide a plurality of staggered receiving surfaces in addition to, or instead of, the plurality of staggered transmissing surfaces 222.

As with the decorrelator 204B, the columns 224 may be the same material or different materials, and may be fused or otherwise bound together. In one embodiment, a collection of discrete columns 224 may be bound together into physical contact by a reflective binder that encloses the peripheral sides of the columns in a reflective tunnel while leaving the receiving and transmitting surfaces 220 and 222 unobscured. The columns 224 form interface surfaces between them where they make physical contact, and the interface surfaces provide reflection and refraction opportunities that improve decorrelation of modes. A reflective binding will reduce any refractive losses. Additionally, the decorrelator 204C may be a unitary medium, such as a prism, fashioned to provide the different thicknesses in a columnar fashion.

The uniformizers 200 and 240 are described as having a single spatial uniformizer and a single temporal uniformizer, each. In alternate embodiments, multiple spatial and/or temporal uniformizers may be used, with each spatial uniformizer the same as, or different from, other spatial uniformizers and each temporal uniformizer the same as, or different from, other temporal uniformizers. In other alternate embodiments, the transmitting surface(s) of the temporal uniformizer may be diffusive, for example by providing a fine texture to the surface. Additionally, if the refractive medium of the temporal uniformizer is dispersive to any degree, the transmitting surface(s) of the temporal uniformizer may be angled to counteract the dispersion, if desired, or a collimating lens may be applied to the transmitted energy.

The energy transmitted by the uniformizer 106, according to any of the embodiments described above, is passed through an aperture 116 to provide an energy field having a desired shape and size. The aperture 116 may be used to truncate any portions of the energy field not having the desired uniformity, such as the peripheral area 216 of the energy field 234 of FIG. 2B. The resulting uniformized energy field is directed toward the substrate disposed on the work surface 120.

The optical elements described in connection with FIGS. 2A-2C are depicted as being generally aligned with an optical axis parallel to a propagation direction of the incident energy 206. In alternate embodiments, one or more of the optical elements may be oriented along an axis that forms an angle with the propagation direction. In such embodiments, receiving and transmitting surfaces may be perpendicular to the propagation axis or angled with respect to the propagation axis. Naturally, light striking a refractive boundary at an angle will be reflected to an extent. Reflective optics may be used to minimize such reflections, for example by utilizing internal reflection where possible and by disposing reflective elements around the refractive media. Optical elements such as the refractive media 204A-204C may have a curvature, if desired, to adjust the axis of propagation.

The temporal decorrelators 204A/B/C are illustrated as affecting the transit of light through them by forcing the light to travel different distances through the refractive medium that makes up the temporal decorrelator. It should be noted that in alternate embodiments, the light transit time may also be affected by sending the light through different materials having different refractive indices. In general, the temporal decorrelators 204A/B/C have a plurality of different paths for the transit of light, and the different paths have different transit times, by virtue of distance traveled through the medium or by virtue of transit through different materials having different refractive indices, or both. Temporal decorrelation is achieved by forcing light to travel over a given distance at different velocities, either by travelling different distances through a refractive medium, by travelling the same distance through differently refractive media, or any combination thereof.

In one embodiment, a unitary medium or prism having a regular shape, such as a rectangular solid, may be fashioned from diverse materials having different refractive indices to create paths having different transit times. In some embodiments, only two materials are used, with interfaces between the two materials at different locations within the unitary medium. If a first material has a thickness $d_1$ and a refractive index of $n_1$ and a second material has a thickness $d_2$, and a refractive index of $n_2$, the effective refractive index of the total optical path through the two refractive media is a weighted average of $n_1$ and $n_2$, to wit $(n_1 d_1 + n_2 d_2)/(d_1 + d_2)$. By providing different distances $d_1$ and $d_2$ for different paths through the medium, differential control of transit time along the various pathways may be achieved. In some embodiments, the light pathways may have transit times that are each different from every other transit time by a coherence time of the light.

Figure 3:
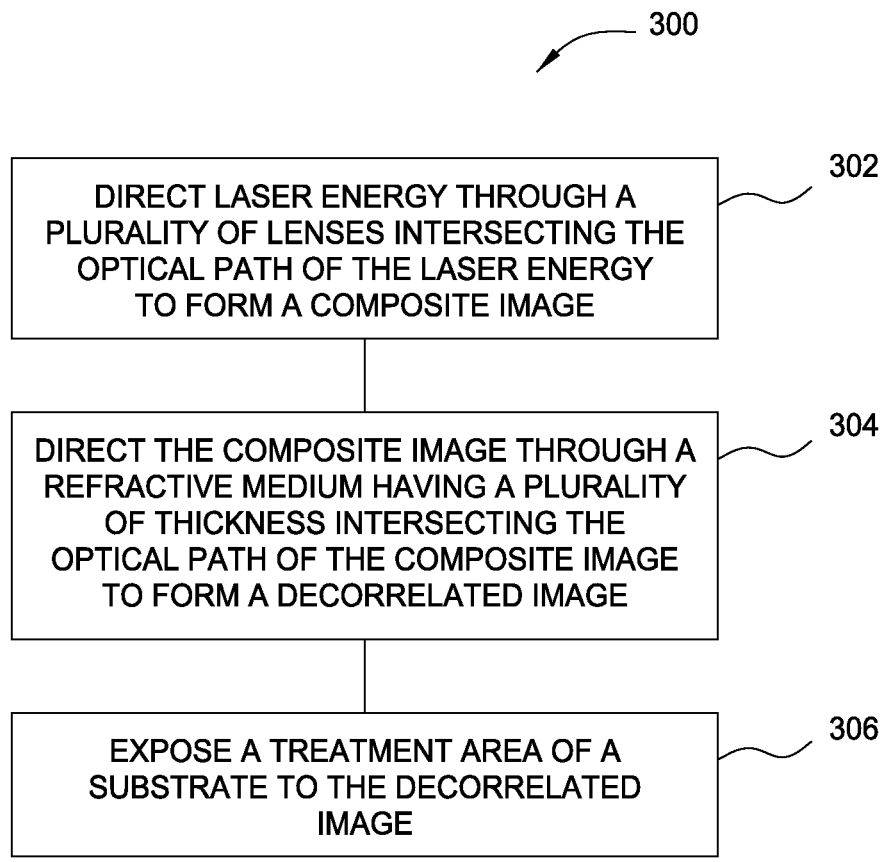
FIG. 3 is a flow diagram summarizing embodiments of a method.

FIG. 3 is a flow diagram summarizing a method 300 according to another embodiment. The method 300 of FIG. 3 is useful for providing a uniform energy field for thermally processing a substrate. At 302, laser energy is directed through a plurality of lenses intersecting the optical path of the laser energy to form a composite image. The laser energy may be a single propagation of laser energy or a combination of two or more propagations, for example two combined beams or two combined pulses. The plurality of lenses may conform to any of the embodiments described above in connection with FIGS. 2A-2C. Each lens projects a portion of the incident energy onto an image field that overlaps with the image fields of all the other lenses. The overlapped portion of the image field, typically a central area of the composite image, is highly spatially uniform, while peripheral portions of the composite image may be less spatially uniformized.

At 304, the composite image is directed through a refractive medium having a plurality of thicknesses intersecting the optical path of the composite image to form a decorrelated image. The refractive medium may conform to any of the embodiments described above in connection with FIGS. 2A-2C. The refractive medium provides a plurality of optical paths having different lengths through which portions of the composite image travel. The different path lengths through the refractive medium result in phase displacement of one portion of the composite image relative to another portion. In some embodiments, every optical path length of the refractive medium is different from every other optical path length by an amount greater than a coherence length of the incident energy. In other embodiments, some optical path lengths may differ from other optical path lengths by an amount greater than a coherence length of the incident energy, while others differ by an amount less than the coherence length of the incident energy. In some embodiments, some optical path lengths may be the same as others, while some are different to provide temporal decorrelation.

The different thicknesses may be distributed along a single axis or along two axes according to a uniform distribution or a non-uniform distribution. The different thicknesses result in a plurality of pairs of receiving surfaces and transmitting surfaces, wherein each receiving/transmitting surface pair is separated by a distance that is different from the distance of at least one other receiving/transmitting surface pair. In some embodiments, the separation distance of all receiving/transmitting surface pairs may be different, while in some embodiments, the surface pairs may fall into groups defined by their separation distances. In some embodiments, the distances differ by more than a coherence length of the energy incident at the receiving surfaces.

At 306, a treatment area of a substrate is exposed to the decorrelated image. The decorrelated image may be passed through an aperture, if desired, to shape, size, and/or truncate the image, for example to remove any portions of the image field that do not conform to a desired uniformity. To process an entire substrate, a first treatment area is typically identified and processed as described above. Then a subsequent treatment area is identified, usually adjacent to the first treatment area, and in some cases overlapping or sharing a boundary with the first treatment area. The substrate is moved to position the subsequent treatment area for processing, and the subsequent treatment area is processed by repeating the directing of 302, the directing of 304, and the exposing of 306. The process is repeated until all desired treatment areas of the substrate are processed.

While the foregoing is directed to embodiments of the invention, other and further embodiments of the invention may be devised without departing from the basic scope thereof.

What is claimed is:

1. An apparatus for improving energy uniformity of coherent light, comprising:
   a plurality of lenses positioned to produce a composite projection field; and
   a refractive medium having one or more first surfaces and a plurality of second surfaces, wherein each second surface is located at one or more distances from the one or more first surfaces, and the refractive medium is positioned to receive the composite projection field at the one or more first surfaces and to transmit an energy field from the plurality of second surfaces, or the refractive medium is positioned to receive the composite projection field at the plurality of second surfaces and to transmit the energy field from the one or more first surfaces, wherein the refractive medium is a prism comprising a plurality of columns having a plurality of different lengths.

2. The apparatus of claim 1, wherein the plurality of lenses is a microlens array.

3. The apparatus of claim 1, wherein surfaces of the refractive medium other than the one or more first surfaces and plurality of second surfaces are coated with a reflective material.

4. The apparatus of claim 1, wherein each surface of the refractive medium transmitting the energy field is diffusive.

5. An apparatus for generating a uniform illumination field, comprising:
   a laser projecting radiation along an optical path;
   a plurality of lenses disposed along a plane perpendicular to the optical path;
   a refractive optic disposed along the optical path, the refractive optic having a first surface intersecting the optical path and a second surface intersecting the optical path, wherein the first surface defines a plane perpendicular to the optical path, and the second surface comprises a plurality of facets, each facet defining a plane perpendicular to the optical path, and wherein no two facets are at the same distance from the first surface, the plurality of lenses being disposed between the laser and the refractive optic, wherein a distance of each facet from the first surface is different from the distance of every other facet from the first surface by an amount greater than a coherence length of the laser.

6. The apparatus of claim 5, wherein a distance between the plurality of lenses and the refractive optic is greater than a focal length of any of the plurality of lenses.

7. An apparatus for generating a uniform illumination field, comprising: a laser projecting radiation along an optical path;
   a plurality of lenses disposed along a plane perpendicular to the optical path;
   a refractive optic disposed along the optical path, the refractive optic having a first surface intersecting the optical path and a second surface intersecting the optical path, wherein the first surface defines a plane perpendicular to the optical path, and the second surface comprises a plurality of facets, each facet defining a plane perpendicular to the optical path, and wherein no two facets are at the same distance from the first surface, the plurality of lenses being disposed between the laser and the refractive optic and further comprising a second laser and a beam combiner between the lasers and the plurality of lenses.

8. The apparatus of claim 7, further comprising a pulse shaper disposed to receive radiation transmitted by the refractive optic.

9. The apparatus of claim 7, wherein the refractive optic comprises a plurality of etalons.

10. An apparatus for generating a uniform illumination field, comprising:
    a laser projecting radiation along an optical path;
    a plurality of lenses disposed along a plane perpendicular to the optical path;
    a refractive optic disposed along the optical path, the refractive optic having a first surface intersecting the optical path and a second surface intersecting the optical path, wherein the first surface defines a plane perpendicular to the optical path, and the second surface comprises a plurality of facets, each facet defining a plane perpendicular to the optical path, and wherein no two facets are at the same distance from the first surface, the plurality of lenses being disposed between the laser and the refractive optic; and further comprising a work surface for receiving a workpiece to be processed by the radiation from the laser, the work surface disposed substantially perpendicular to the optical path of the laser.

* * * * *